United States Patent
Huang

(10) Patent No.: US 10,802,962 B1
(45) Date of Patent: Oct. 13, 2020

(54) MEMORY DEVICE AND CONTROL METHOD FOR PERFORMING REFRESH OPERATION BASED ON ERASING LOOP NUMBER

(71) Applicant: Winbond Electronics Corp., Taichung (TW)

(72) Inventor: Chung-Meng Huang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/427,318

(22) Filed: May 30, 2019

(51) Int. Cl.
*G06F 12/02* (2006.01)
*G06F 3/06* (2006.01)

(52) U.S. Cl.
CPC ........ *G06F 12/0246* (2013.01); *G06F 3/0604* (2013.01); *G06F 3/0652* (2013.01); *G06F 3/0679* (2013.01); *G06F 2212/1016* (2013.01); *G06F 2212/7205* (2013.01)

(58) Field of Classification Search
CPC .... G06F 3/0604; G06F 3/0652; G06F 3/0679; G06F 12/0246; G06F 2212/1016; G06F 2212/7205
See application file for complete search history.

(56) References Cited

U.S. PATENT DOCUMENTS

| | | | |
|---|---|---|---|
| 5,963,473 A | 10/1999 | Norman | |
| 6,160,738 A * | 12/2000 | Atsumi | G11C 16/3431 365/185.25 |
| 6,633,500 B1 | 10/2003 | Chou et al. | |
| 6,639,839 B1 | 10/2003 | Chou et al. | |
| 8,804,436 B1 * | 8/2014 | Chan | G11C 16/3431 365/185.22 |
| 2008/0055997 A1 * | 3/2008 | Lee | G11C 16/349 365/185.18 |
| 2009/0048976 A1 * | 2/2009 | Hars | G06F 12/1408 705/50 |
| 2009/0300265 A1 * | 12/2009 | Vyssotski | G11C 16/349 711/100 |
| 2010/0061153 A1 | 3/2010 | Yen et al. | |
| 2015/0078087 A1 | 3/2015 | Shim et al. | |

FOREIGN PATENT DOCUMENTS

TW 201523619 6/2015

OTHER PUBLICATIONS

"Office Action of Taiwan Counterpart Application", dated May 29, 2020, p. 1-p. 8.

* cited by examiner

*Primary Examiner* — Larry T Mackall
(74) *Attorney, Agent, or Firm* — JCIPRNET

(57) ABSTRACT

A memory device and a control method for a non-volatile memory are provided. The non-volatile memory includes a target erasing region and an unselected region. The control method includes: erasing a target memory cell in the target erasing region. The unselected region is a region, excluding the target erasing region, in the non-volatile memory. The step of erasing the target memory cell includes an erasing operation, a verification operation, and an erasing loop after failing to pass the verification operation. The number of times of performing the erasing loop is an integer greater than or equal to 0. The control method further includes: refreshing a pre-defined portion in the unselected region, wherein a capacity of the pre-defined portion is determined by the number of times of performing the erasing loop.

10 Claims, 3 Drawing Sheets

MEMORY DEVICE AND CONTROL METHOD FOR PERFORMING REFRESH OPERATION BASED ON ERASING LOOP NUMBER

BACKGROUND

Technical Field

The disclosure relates to a control technology of a memory device. More particularly, the disclosure relates to a memory device and a control method for a non-volatile memory.

Description of Related Art

A flash memory memorizes data by means of a threshold voltage Vt of memory cells. To adjust the threshold voltage Vt of the memory cells, a programming operation and an erasing operation are required to be performed on the memory cells. In an NOR-type flash memory, a p-well layer in each region is often equipped with a plurality of memory blocks; for instance, four memory blocks are designed to be located in the p-well layer in the same region. FIG. 1 is a schematic view of a distribution of a threshold voltage while an erasing operation is performed on the memory cells which have undergone the erasing operation and the memory cells which have undergone the programming operation; a horizontal axis in FIG. 1 represents the threshold voltage of the memory cells, and a vertical axis in FIG. 1 represents the number of memory cells at the threshold voltage. When the erasing operation is to be performed on the designated memory cells (with data capacity of 4 KB, for instance), the threshold voltage of the erased memory cells is lowered down (e.g., as shown by the threshold voltage distribution 110 of the memory cells depicted in FIG. 1). On the other hand, while the NOR-type flash memory is performing the erasing operation, a voltage is required to be supplied to the p-well layer, and each memory cell in the p-well layer in the same region is subject to the disturbance of the erasing operation, which leads to the reduction of the threshold voltage Vt of the not-yet-erased-but-programmed memory cells in the p-well layer in the region due to the excessive number of times of performing the unnecessary erasing operations, as shown by the threshold voltage distributions 120 and 130 of the memory cells in FIG. 1. As such, the data storage performance of the programmed memory cells is negatively affected. Such disturbance is referred to as "bulk erase disturb". Accordingly, it is required to perform a refreshing operation on non-designated memory cells in the p-well layer in the same region, thereby increasing the threshold voltage Vt of the programmed memory cells.

However, performing the refreshing operation on each non-designated memory cell consumes a considerable amount of time. Therefore, how to take both the refreshing time of the memory cells and the data access performance into account is one of the issues to be solved in the field of controlling the existing flash memory device.

SUMMARY

The disclosure provides a memory device and a control method for a non-volatile memory, whereby a capacity of to-be-refreshed memory blocks can be flexibly adjusted, and time to be spent on the refreshing operation can be properly saved.

In an embodiment of the disclosure, a control method for a non-volatile memory is provided, and the non-volatile memory includes a target erasing region and an unselected region. The control method includes: erasing a target memory cell in the target erasing region, wherein the unselected region is a region excluding the target erasing region in the non-volatile memory, the erasing operation includes an erasing operation, a verification operation, and an erasing loop after failing to pass the verification operation, and the number of times of performing the erasing loop is an integer greater than or equal to 0; refreshing a pre-defined portion in the unselected region, wherein a capacity of the pre-defined portion is determined by the number of times of performing the erasing loop.

In an embodiment of the disclosure, a memory device including a non-volatile memory and a controller is provided. The non-volatile memory includes a target erasing region and an unselected region. The controller controls the non-volatile memory to perform an erasing operation on the target memory cell in the target erasing region. The unselected region is a region, excluding the target erasing region, in the non-volatile memory. The step of erasing the target memory cell includes an erasing operation, a verification operation, and an erasing loop after failing to pass the verification operation. The controller controls the non-volatile memory to refresh a pre-defined portion in the unselected region, wherein a capacity of the pre-defined portion is determined by the number of times of performing the erasing loop.

In view of the above, in the memory device and the control method for the non-volatile memory provided in one or more embodiments of the disclosure, the capacity of the to-be-refreshed memory blocks is adjusted according to the number of times of performing the erasing loop on the target memory cell. The less the number of times of performing the erasing loop, the easier the threshold voltage of the memory cells in the non-volatile memory can be adjusted; hence, the refreshing operation can be performed on the smaller pre-defined portion in the unselected region, so as to properly reduce the time spent on the refreshing operation. By contrast, the more the number of times of performing the erasing loop, the harder the threshold voltage of the memory cells in the non-volatile memory can be adjusted; accordingly, the refreshing operation can be performed on the larger pre-defined portion in the unselected region, so as to ensure good data access performance of the memory cells. As such, in one or more embodiments, the refreshing operation can be flexibly performed on the pre-defined portions with different capacities, so as to properly save the time spent on erasing the memory and the refreshing operation.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

The disclosure aims at providing a memory device in which a capacity of to-be-refreshed memory blocks can be adjusted according to the number of times of performing an erasing loop on a target memory cell, so as to flexibly and properly reduce the time spent on erasing the memory and performing the refreshing operation. Detailed embodiments are given below for better descriptions.

Figure 1:
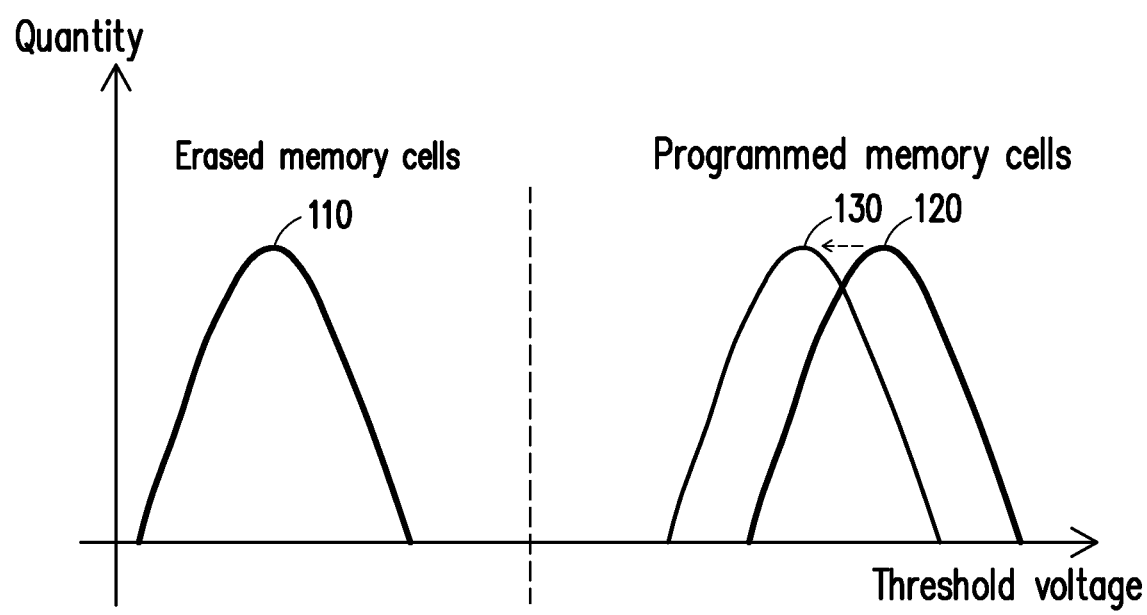
FIG. 1 is a schematic view of a distribution of a threshold voltage while an erasing operation is performed on erased memory cells and programmed memory cells.
Figure 2:
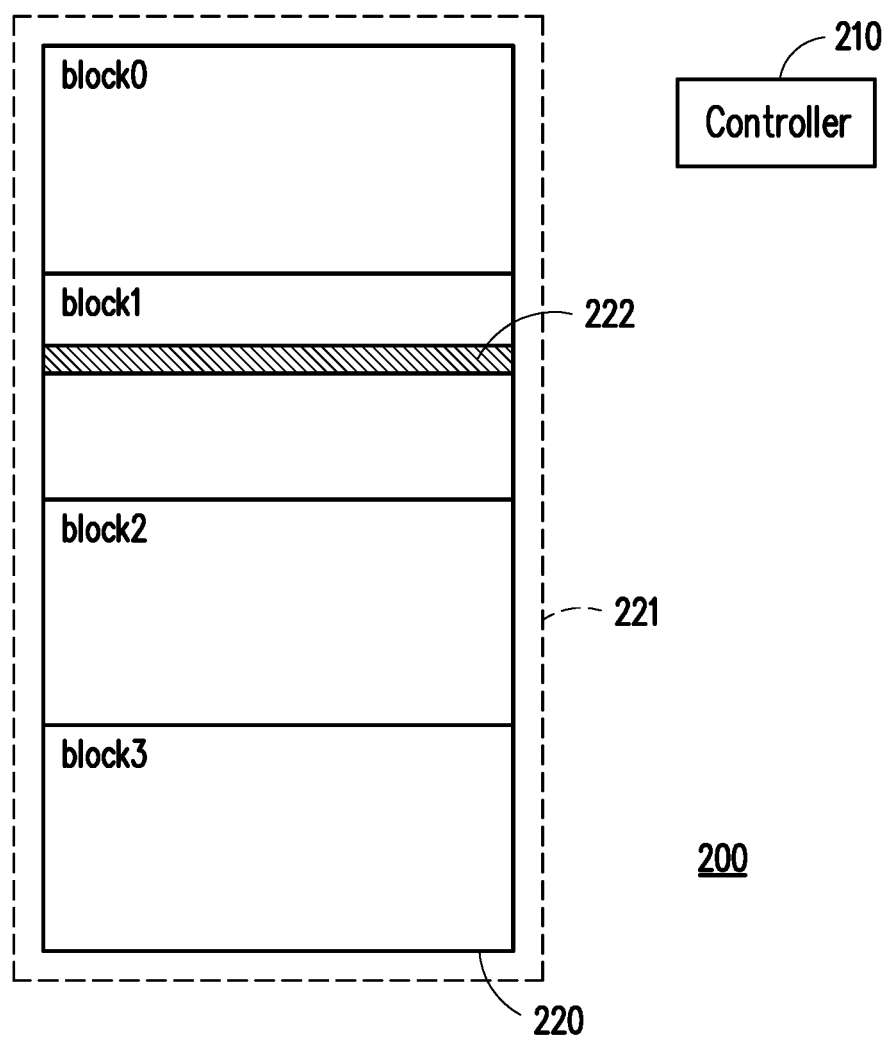
FIG. 2 is a schematic view of a memory device according to an embodiment of the disclosure.

FIG. 2 is a schematic view of a memory device 200 according to an embodiment of the disclosure. The memory device 200 mainly includes a controller 210 and a non-volatile memory 220. The non-volatile memory 220 provided in the present embodiment is an NOR-type flash memory, and people having ordinary skill in the pertinent art can apply the memory to any other similar memory device. The non-volatile memory 220 can have a plurality of memory blocks in one p-well layer 221, and four memory blocks block0-block3 are exemplified in the present embodiment. The non-volatile memory 220 can be equipped with a plurality of p-well layers, and the p-well layer 221 merely serves as an example in the present embodiment. In the present embodiment, the capacity of the non-volatile memory 220 (i.e., the data capacity of the memory 220) is 256 KB, the capacity of the memory blocks block0-block3 is 64 KB, respectively, and the capacity of the target memory cell 222 is 4 KB. It is presumed that the memory device 200 applies a control method provided in the present embodiment on the target memory cell 222, and the control method herein refers to the method of erasing a target erasing region in the non-volatile memory 220. The memory block block1 provided in the present embodiment is the target erasing region, and the memory blocks block0 and block2-block3 are unselected regions. The unselected regions (the memory blocks block0 and block2-block3) are regions excluding the target erasing region (the memory block block1) in the non-volatile memory 220. That is, the non-volatile memory 220 includes the target erasing region (the memory block block1) and the unselected regions (the memory blocks block0 and block2-block3). The controller 210 controls the non-volatile memory 220 and a power supply, so as to perform the method of erasing the target memory cell 222 in the non-volatile memory 220 according to the present embodiment.

Figure 3:
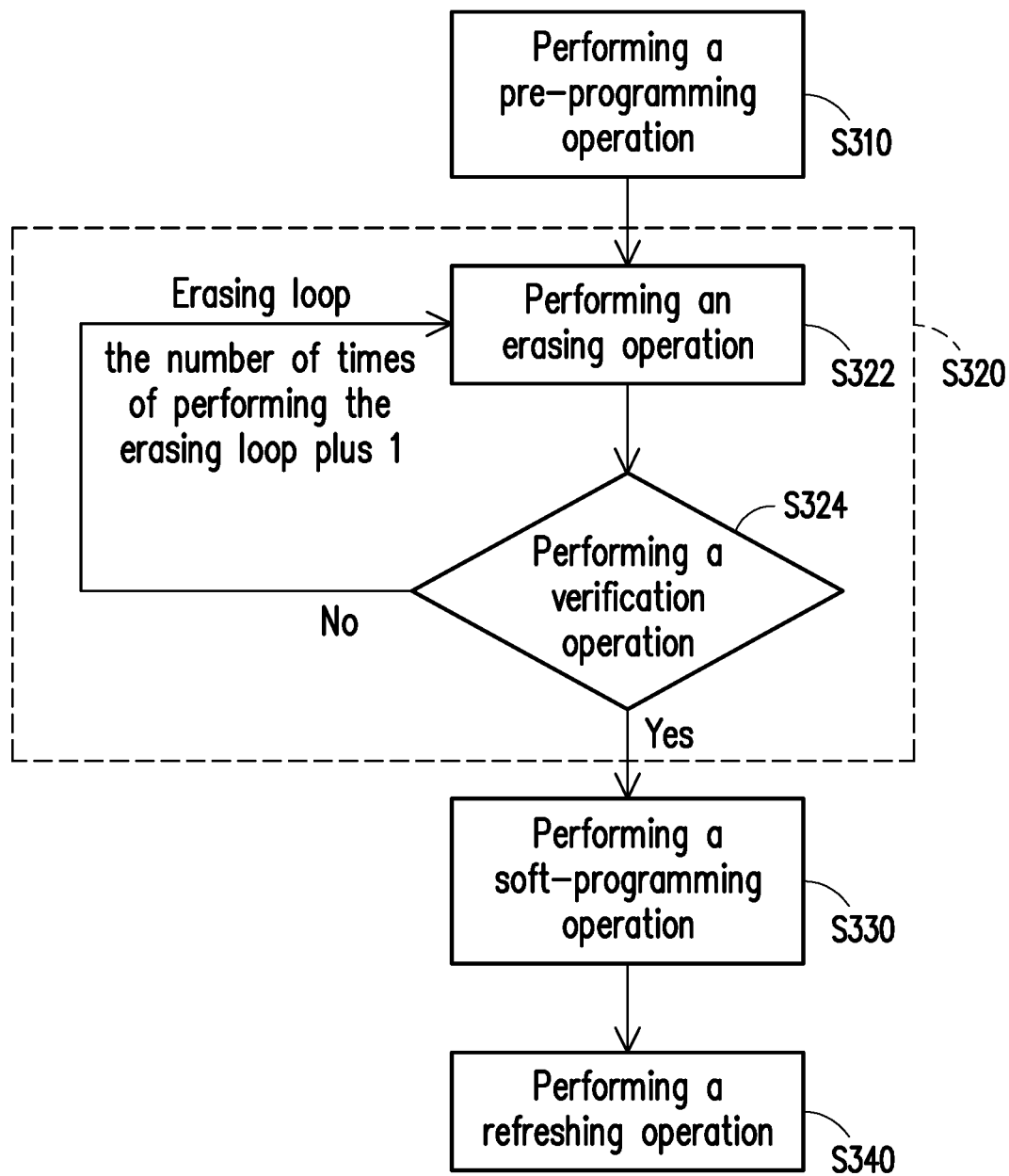
FIG. 3 is a flowchart illustrating a control method for a non-volatile memory according to an embodiment of the disclosure.

FIG. 3 is a flowchart illustrating a control method for the non-volatile memory 220 according to an embodiment of the disclosure. With reference to FIG. 2 and FIG. 3, in step S310, the controller 210 first adjusts the target erasing region in the non-volatile memory, so as to perform a pre-programming operation. In order to facilitate the close distribution of the threshold voltages Vt in the memory cells, before the erasing operation starts, the pre-programming operation is performed on all memory cells according to the present embodiment, so as to ensure that all the memory cells are at the uniform high threshold voltage Vt before the erasing operation is performed. The pre-programming operation can be considered as pre-treatment on an array of the memory cells in the non-volatile memory 220 before the erasing operation is performed. This operation is based on the following assumption: if no pre-programming operation is performed before the erasing operation is performed, the memory cells storing data have a higher threshold voltage Vt, and the memory cells not storing data have a lower threshold voltage Vt. The relatively wide distribution of the threshold voltages Vt in the memory cells will become an excessively wide distribution of the threshold voltages Vt in the memory cells after the erasing operation is completed. By contrast, before the erasing operation is performed, if all of the memory cells are configured to be at the uniform high threshold voltage Vt, the issue of excessively erasing some of the memory cells can be minimized. In some embodiments of the disclosure, according to the control method for the non-volatile memory, it is also likely to directly proceed step S320 depicted in FIG. 2 without performing the pre-programming operation on all of the memory cells.

In step S320, the controller 210 controls the non-volatile memory 220 to perform the erasing operation on the target memory cell 222 in the target erasing region. In the present embodiment, the step S320 of performing the erasing operation on the target memory cell 222 includes the erasing operation (step S322), a verification operation (step S324), and an erasing loop after failing to pass the verification operation. Specifically, when the controller 210 performs the erasing operation (step S322) on the target memory cell 222, the verification operation (step S324) is carried out to determine whether the threshold voltage of the target memory cell 222 is lower than or equal to an erasing verification voltage. If it is determined that the threshold voltage of the target memory cell 222 is lower than or equal to the erasing verification voltage, it indicates that the target memory cell 222 passes the verification operation (i.e., step S324 is "Yes"). On the contrary, if it is determined that the threshold voltage of the target memory cell 222 is higher than the erasing verification voltage, it indicates that the target memory cell 222 fails to pass the verification operation (i.e., step S324 is "No"), and the erasing operation (step S322) is required to be performed again. In the present embodiment, the erasing operation performed after the failure to pass the verification operation is called as an erasing loop, and the number of times of performing the erasing loop is automatically recorded. Note that the number of times of performing the erasing loop is an integer greater than or equal to 0. According to the control method provided in the present embodiment, during initialization, the number of times of performing the erasing loop is set as 0; when the target memory cell 222 fails to pass the verification operation, and the erasing operation is performed again, i.e., when the step S324 is "No", 1 is accumulated to the number of times of performing the erasing loop each time (as shown by "the number of times of performing the erasing loop plus 1" in the drawings) until the target memory cell 222 passes the verification operation. The number of times of performing the erasing loop is applied or taken as a reference in a subsequent refreshing operation (step S340). In some embodiments, the number of times of performing the erasing loop can be temporarily stored in a buffer of the memory device 200.

When the controller 210 in step S320 performs the erasing operation on the target memory cell 222 in the target erasing region, in step S330, the controller 210 controls the non-volatile memory 220 to perform a soft-programming operation on the target memory cell 222. The "soft-programming operation" is to set a threshold voltage of the target memory cell 222 as a voltage higher than or equal to the soft-programming verification voltage, and the soft-programming verification voltage is lower than the erasing verification voltage applied in step S324. Thereby, the soft-programming operation (step S330) can ensure the threshold voltage of the target memory cell 222 not to be excessively high; otherwise, while the programming operation is subsequently performed on the target memory cell 222, it will be difficult to adjust the threshold voltage of the target memory cell 222 to be higher than the erasing verification voltage. In step S330 provided in the present embodiment, it can be determined whether the threshold voltage of the target memory cell 222 is a voltage higher than or equal to the soft-programming verification voltage. If the threshold voltage of the target memory cell 222 is higher than or equal to the soft-programming verification voltage, it is not necessary to perform the soft-programming operation, and the subsequent step S340 can be carried out. By contrast, if the threshold voltage of the target memory cell 222 is lower than the soft-programming verification voltage, the soft-programming operation is required to be performed until the threshold voltage of the target memory cell 222 is higher than or equal to the soft-programming verification voltage. In some embodiments of the disclosure, according to the control method for the non-volatile memory, it is also likely to directly proceed step S340 depicted in FIG. 2 after performing step S320 without performing the soft-programming operation on all of the memory cells.

In step S340, the controller 210 controls the non-volatile memory 220 to refresh a pre-defined portion in the unselected regions, i.e., to perform a refreshing operation on the pre-defined portion in the unselected regions. Note that the capacity of the pre-defined portion in, step S340 is determined by the number of times of performing the erasing loop. Particularly, the less the number of times of performing the erasing loop, the easier the threshold voltage of the target memory cell 222 in the non-volatile memory can be adjusted; hence, the refreshing operation can be performed on the smaller pre-defined portion in the unselected regions, so as to properly reduce the time spent on the refreshing operation. That is, the less the number of times of performing the erasing loop, the smaller the ratio of the capacity of the pre-defined portion to the capacity of the non-volatile memory 220. On the contrary, the more the number of times of performing the erasing loop, the harder the threshold voltage of the memory cells in the non-volatile memory can be adjusted; accordingly, the refreshing operation can be performed on the larger pre-defined portion in the unselected regions, so as to ensure good data access performance of the memory cells. That is, the more the number of times of performing the erasing loop, the larger the ratio of the capacity of the pre-defined portion to the capacity of the non-volatile memory 220.

Table 1 shows the number of times of performing the erasing loop, the capacity of the pre-defined portion, the ratio of the capacity of the pre-defined portion to the capacity of the non-volatile memory, and the time required for performing the refreshing operation.

TABLE 1

| The number of times of performing the erasing loop | 0 | N1 | N2 | N3 | N4 | N5 or more than N5 |
|---|---|---|---|---|---|---|
| The capacity of the pre-defined portion | 8 KB | 16 KB | 32 KB | 64 KB | 128 KB | 256 KB |
| The ratio of the capacity of the pre-defined portion to the capacity of the non-volatile memory | (1/32) | (1/16) | (1/8) | (1/4) | (1/2) | 1 |
| The refreshing time | 1.25 ms | 2.5 ms | 5 ms | 10 ms | 20 ms | 40 ms |

In Table 1, N1, N2, N3, N4, and N5 are all positive integers, and $0<N1<N2<N3<N4<N5$. As shown in Table 1, if the number of times of performing the erasing loop is 0, the capacity of the pre-defined portion is 8 KB, i.e., the capacity of the non-volatile memory 220 times ½ to the fifth power (1/32); if the number of times of performing the erasing loop is N1, the capacity of the pre-defined portion is 16 KB, i.e., the capacity of the non-volatile memory 220 times ½ to the fourth power (1/16); if the number of times of performing the erasing loop is N2, the capacity of the pre-defined portion is 32 KB, i.e., the capacity of the non-volatile memory 220 times ½ to the third power (1/8); if the number of times of performing the erasing loop is N3, the capacity of the pre-defined portion is 64 KB, i.e., the capacity of the non-volatile memory 220 times ½ to the second power (1/4); if the number of times of performing the erasing loop is N4, the capacity of the pre-defined portion is 128 KB, i.e., the capacity of the non-volatile memory 220 times ½ to the first power (½); if the number of times of performing the erasing loop is N5 or greater than N5, the capacity of the pre-defined portion is 256 KB, i.e., the capacity of the non-volatile memory 220.

While the control method provided in one or more embodiments of the disclosure is applied, the refreshed pre-defined portion in the unselected region corresponding to the target memory cell 222 should not be overlapped with the refreshed pre-defined portion in the unselected region corresponding to the next target memory cell, and the refreshing operation can be performed sequentially on the pre-defined portion in the unselected regions in the non-volatile memory, whereby each unselected region can undergone the refreshing operation within a certain period of time, and the loss of data in the programmed memory cells in certain memory block due to the fact that the refreshing operation is not performed on the programmed memory cells for an excessively long period of time can be prevented. For instance, during a booting operation of the memory device 200 provided in the present embodiment, a random number generator is applied to generate a random number, whereby one of a plurality of memory blocks is randomly selected as an initial refreshing region of the pre-defined portion in the unselected region, and the initial refreshing region is refreshed. From the initial refreshing region which has been selected, the memory device then applies a sequence counter and sequentially refreshes other memory blocks in the memory device.

In another aspect, it is known to people applying the embodiments provided herein that if the number of times of performing the erasing loop exceeds a certain number of times, the correspondingly refreshed pre-defined portion is the entire unselected region, it is inevitable that the pre-defined portion is overlapped with the refreshed pre-defined portion in the unselected region corresponding to the next target memory cell.

To sum up, in the memory device and the control method for the non-volatile memory provided in one or more embodiments of the disclosure, the capacity of the to-be-refreshed memory blocks is adjusted according to the number of times of performing the erasing loop on the target memory cell. The less the number of times of performing the erasing loop, the easier the threshold voltage of the memory cells in the non-volatile memory can be adjusted; hence, the refreshing operation can be performed on the smaller pre-defined portion in the unselected region, so as to properly reduce the time spent on the refreshing operation. By contrast, the more the number of times of performing the erasing loop, the harder the threshold voltage of the memory cells in the non-volatile memory can be adjusted; accordingly, the refreshing operation can be performed on the larger pre-defined portion in the unselected region, so as to ensure good data access performance of the memory cells. As such, in one or more embodiments, the refreshing operation can be flexibly performed on the pre-defined portions with different capacities, so as to properly save the time spent on erasing the memory and the refreshing operation.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A control method for a non-volatile memory, the non-volatile memory comprising a target erasing region and an unselected region, the control method comprising:
   erasing a target memory cell in the target erasing region, wherein the unselected region is a region excluding the target erasing region in the non-volatile memory, the step of erasing the target memory cell comprises an erasing operation, a verification operation, and an erasing loop after failing to pass the verification operation, and the number of times of performing the erasing loop is an integer greater than or equal to 0;
   comparing the number of times of performing the erasing loop to a plurality of threshold values; and
   refreshing a pre-defined portion in the unselected region, wherein a capacity of the pre-defined portion is determined according to a comparison of the number of times of performing the erasing loop and the plurality of threshold values.

2. The control method according to claim 1, wherein the non-volatile memory is an NOR-gate flash memory device.

3. The control method according to claim 1, wherein the target erasing region and the unselected region are located in one p-well layer of the non-volatile memory.

4. The control method according to claim 1, wherein the target memory cell undergoing the erasing operation has a threshold voltage lower than or equal to an erasing verification voltage, and the control method further comprises:
   after erasing the target memory cell in the target erasing region, performing a soft-programming operation on the target memory cell, wherein the target memory cell is configured to have the threshold voltage higher than or equal to a soft-programming verification voltage, and the soft-programming verification voltage is lower than the erasing verification voltage.

5. The control method according to claim 1, further comprising:
   before erasing the target memory cell in the target erasing region, performing a pre-programming operation on the target erasing region.

6. The control method according to claim 1, wherein the less the number of times of performing the erasing loop, the smaller a ratio of the capacity of the pre-defined portion to the non-volatile memory; the more the number of times of performing the erasing loop, the larger the ratio of the capacity of the pre-defined portion to the non-volatile memory.

7. The control method according to claim 1, wherein
   in response to determining that the number of times of performing the erasing loop is 0, a ratio of the capacity of the pre-defined portion to a capacity of the non-volatile memory is 1:32,
   in response to determining that the number of times of performing the erasing loop is N1, the ratio of the capacity of the pre-defined portion to the capacity of the non-volatile memory is 1:16,
   in response to determining that the number of times of performing the erasing loop is N2, the ratio of the capacity of the pre-defined portion to the capacity of the non-volatile memory is 1:8,
   in response to determining that the number of times of performing the erasing loop is N3, the ratio of the capacity of the pre-defined portion to the capacity of the non-volatile memory is 1:4,
   in response to determining that the number of times of performing the erasing loop is N4, the ratio of the capacity of the pre-defined portion to the capacity of the non-volatile memory is 1:2, and
   in response to determining that the number of times of performing the erasing loop is N5 or greater than N5, the ratio of the capacity of the pre-defined portion to the capacity of the non-volatile memory is 1:1, wherein N1, N2, N3, N4, and N5 are positive integers, and $0<N1<N2<N3<N4<N5$.

8. The control method according to claim 1, further comprising:
   during a booting operation, randomly selecting one of a plurality of memory blocks of the non-volatile memory as an initial refreshing region of the pre-defined portion in the unselected region according to a random number and refreshing the initial refreshing region; and
   sequentially refreshing the plurality of memory blocks in the non-volatile memory.

9. A memory device comprising:
   a non-volatile memory comprising a target erasing region and an unselected region; and
   a controller controlling the non-volatile memory to erase a target memory cell in the target erasing region, wherein the unselected region is a region excluding the target erasing region in the non-volatile memory, the step of erasing the target memory cell comprises an erasing operation, a verification operation, and an erasing loop after failing to pass the verification operation, and the number of times of performing the erasing loop is an integer greater than or equal to 0,
   wherein the controller is configured to compare the number of times of performing the erasing loop to a plurality of threshold values,
   wherein the controller controls the non-volatile memory to refresh a pre-defined portion in the unselected region, wherein a capacity of the pre-defined portion is determined according to a comparison of the number of times of performing the erasing loop to the plurality of threshold values.

10. The memory device according to claim 9, wherein the non-volatile memory is an NOR-gate flash memory device.

\* \* \* \* \*